(12) United States Patent
Her et al.

(10) Patent No.: US 11,094,720 B2
(45) Date of Patent: Aug. 17, 2021

(54) ARRAY SUBSTRATE HAVING A GATE DRIVING CIRCUIT WITH AN IMPROVED OUTPUT CHARACTERISTIC AND A DISPLAY APPARATUS HAVING THE SAME

(71) Applicant: SAMSUNG DISPLAY CO., LTD., Gyeonggi-do (KR)

(72) Inventors: Yong-Koo Her, Gyeonggi-do (KR); Jin Jeon, Gyeonggi-do (KR); Yong-Han Park, Gyeonggi-do (KR); Sang-Hoon Lee, Gyeonggi-do (KR); Ji-Suk Lim, Daejeon (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 181 days.

(21) Appl. No.: 13/936,971

(22) Filed: Jul. 8, 2013

(65) Prior Publication Data

US 2013/0293800 A1 Nov. 7, 2013

Related U.S. Application Data

(62) Division of application No. 11/291,366, filed on Dec. 1, 2005, now Pat. No. 8,493,524.

(30) Foreign Application Priority Data

Jan. 6, 2005 (KR) .......................... 10-2005-0001203

(51) Int. Cl.
*H01L 27/12* (2006.01)
*G02F 1/1368* (2006.01)
(Continued)

(52) U.S. Cl.
CPC .......... *H01L 27/1255* (2013.01); *G02F 1/136* (2013.01); *G02F 1/1368* (2013.01);
(Continued)

(58) Field of Classification Search
CPC ............... G02F 1/1368; G02F 1/13454; G02F 2001/13629; G02F 1/136
See application file for complete search history.

(56) References Cited

U.S. PATENT DOCUMENTS 5,493,129 A 2/1996 Matsuzaki et al.
6,239,468 B1 * 5/2001 Chang et al. .................. 257/347
(Continued)

*Primary Examiner* — Lauren Nguyen
(74) *Attorney, Agent, or Firm* — F. Chau & Associates, LLC

(57) ABSTRACT

An array substrate and a display apparatus including the array substrate are provided. The array substrate includes a substrate divided into a display area and a peripheral area adjacent to the display area. A pixel array is formed on the substrate corresponding to the display area and receives a driving signal. A driving circuit includes a plurality of stages and is formed on the substrate corresponding to the peripheral area. Each of the stages includes a first transistor having a source electrode connected to an output terminal to output the driving signal, a channel layer formed between a gate insulating layer and the source electrode, the channel layer having an opening to facilitate contact between a portion of the gate insulating layer and the source electrode, and a capacitor defined by a gate electrode of the first transistor, the source electrode, and the gate insulating layer contacting the source electrode.

18 Claims, 9 Drawing Sheets

(51) Int. Cl.
*G02F 1/1345* (2006.01)
*G02F 1/1362* (2006.01)
*G02F 1/136* (2006.01)
*G02F 1/1343* (2006.01)
*H01L 29/786* (2006.01)

(52) U.S. Cl.
CPC .... *G02F 1/13454* (2013.01); *G02F 1/134363* (2013.01); *G02F 1/136286* (2013.01); *H01L 27/1214* (2013.01); *H01L 29/786* (2013.01)

(56) References Cited

U.S. PATENT DOCUMENTS

| | | | |
|---|---|---|---|
| 2003/0222311 A1* | 12/2003 | Kim | G02F 1/13454 257/347 |
| 2004/0164296 A1 | 8/2004 | Yamazaki et al. | |
| 2004/0179144 A1 | 9/2004 | Jeon | |
| 2005/0038913 A1* | 2/2005 | Yasuda | 709/248 |
| 2005/0041168 A1* | 2/2005 | Jang et al. | 349/43 |
| 2006/0033105 A1 | 2/2006 | Fujii et al. | |

* cited by examiner

ARRAY SUBSTRATE HAVING A GATE DRIVING CIRCUIT WITH AN IMPROVED OUTPUT CHARACTERISTIC AND A DISPLAY APPARATUS HAVING THE SAME

CROSS-REFERENCE TO RELATED APPLICATION

This application is a Divisional of U.S. application Ser. No. 11/291,366 filed on Dec. 1, 2005, which claims priority under 35 U.S.C. 119 to Korean Patent Application No. 10-2005-0001203, filed on Jan. 6, 2005, the disclosures of which are incorporated by reference herein in their entireties.

BACKGROUND OF THE INVENTION

Technical Field

The present invention relates to an array substrate, and more particularly, to an array substrate having a gate driving circuit with an improved output characteristic and a display apparatus having the same.

Discussion of the Related Art

A liquid crystal display is one of the most widely used flat panel displays. For example, a liquid crystal display is commonly found in a variety of electronic devices such as flat screen televisions, laptop computers, cell phones and digital cameras.

In general, a liquid crystal display includes a display panel that displays an image in response to a gate signal and a data signal, a gate driving circuit that outputs the gate signal and a data driving circuit that outputs the data signal.

The display panel includes an array substrate on which a plurality of gate lines for receiving the gate signal and a plurality of data lines for receiving the data signal are formed, a color filter substrate facing the array substrate and a liquid crystal layer disposed between the array substrate and the color filter substrate.

The gate driving circuit and the data driving circuit are typically mounted on the liquid crystal display panel. Recently, however, the gate driving circuit has been formed on the array substrate to reduce the size of the liquid crystal display and enhance its productivity.

When the gate driving circuit is formed on the array substrate, the gate driving circuit includes a shift register having a cascade connection. Each of the stages includes a plurality of transistors and a plurality of capacitors.

The capacitors are connected to an output terminal of the shift register to ensure that the gate signal outputted from the shift register has a sufficient rise time. Thus, when a charging capacity of the capacitors is insufficient, the rise time is shortened, thereby deteriorating the output characteristic of the gate driving circuit.

In one technique for enhancing the charging capacity of the capacitors, an electrode area of the capacitors is increased. This, however, causes an increase in the parasitic capacitance that exists between the capacitor electrode and a common electrode of the color filter substrate.

As such, a need exists for an array substrate that includes capacitors having an enhanced charging capacity for reducing the deterioration of the output characteristic of a gate driving circuit.

SUMMARY OF THE INVENTION

An array substrate having a gate driving circuit with an improved output characteristic and a display apparatus having the same are provided.

In one aspect of the present invention, an array substrate includes a substrate, a pixel array and a driving circuit. The substrate is divided into a display area and a peripheral area adjacent to the display area. The pixel array receives a driving signal and is formed on the substrate corresponding to the display area. The driving circuit includes a plurality of stages and is formed on the substrate corresponding to the peripheral area. Each of the stages includes a first transistor having a source electrode connected to an output terminal for outputting the driving signal, a channel layer formed between a gate insulating layer and the source electrode, the channel layer having an opening to facilitate contact between a portion of the gate insulating layer and the source electrode, and a capacitor defined by a gate electrode of the first transistor, the source electrode, and the portion of the gate insulating layer contacting the source electrode.

In another aspect of the present invention, a display apparatus includes an array substrate and an opposite substrate facing the array substrate. The array substrate includes a substrate, a pixel array and a d riving circuit. The substrate is divided into a display area and a peripheral area adjacent to the display area. The pixel array receives a driving signal and is formed on the substrate corresponding to the display area. The driving circuit includes a plurality of stages and is formed on the substrate corresponding to the peripheral area. Each of the stages includes a transistor having a source electrode connected to an output terminal for outputting the driving signal, a channel layer formed between a gate insulating layer and the source electrode, the channel layer having an opening to facilitate contact between a portion of the gate insulating layer and the source electrode, and a capacitor defined by a gate electrode of the transistor, the source electrode, and the portion of the gate insulating layer contacting the source electrode.

In still another aspect of the present invention, a display apparatus includes an array substrate, an opposite substrate facing the array substrate, a liquid crystal layer disposed between the array substrate and the opposite substrate, and a driving chip mounted on the array substrate to output a data signal. The array substrate includes a substrate, a pixel array and a gate driving circuit. The substrate is divided into a display area and a peripheral area adjacent to the display area. The pixel array receives a gate signal and a data signal from the driving chip and is formed on the substrate corresponding to the display area. The gate driving circuit includes a plurality of stages. The gate driving circuit is formed on the substrate corresponding to the peripheral area and applies the gate signal to the pixel array. Each of the stages includes a transistor having a source electrode connected to an output terminal for outputting the gate signal, a channel layer formed between a gate insulating layer and the source electrode, the channel layer having an opening to facilitate contact between a portion of the gate insulating layer and the source electrode, and a capacitor defined by a gate electrode of the transistor, the source electrode, and the portion of the gate insulating layer contacting the source electrode.

BRIEF DESCRIPTION OF THE DRAWINGS

The above and other aspects of the present invention will become more apparent by describing in detail exemplary embodiments thereof with reference to the attached drawings in which.

DESCRIPTION OF EXEMPLARY EMBODIMENTS

Figure 1:
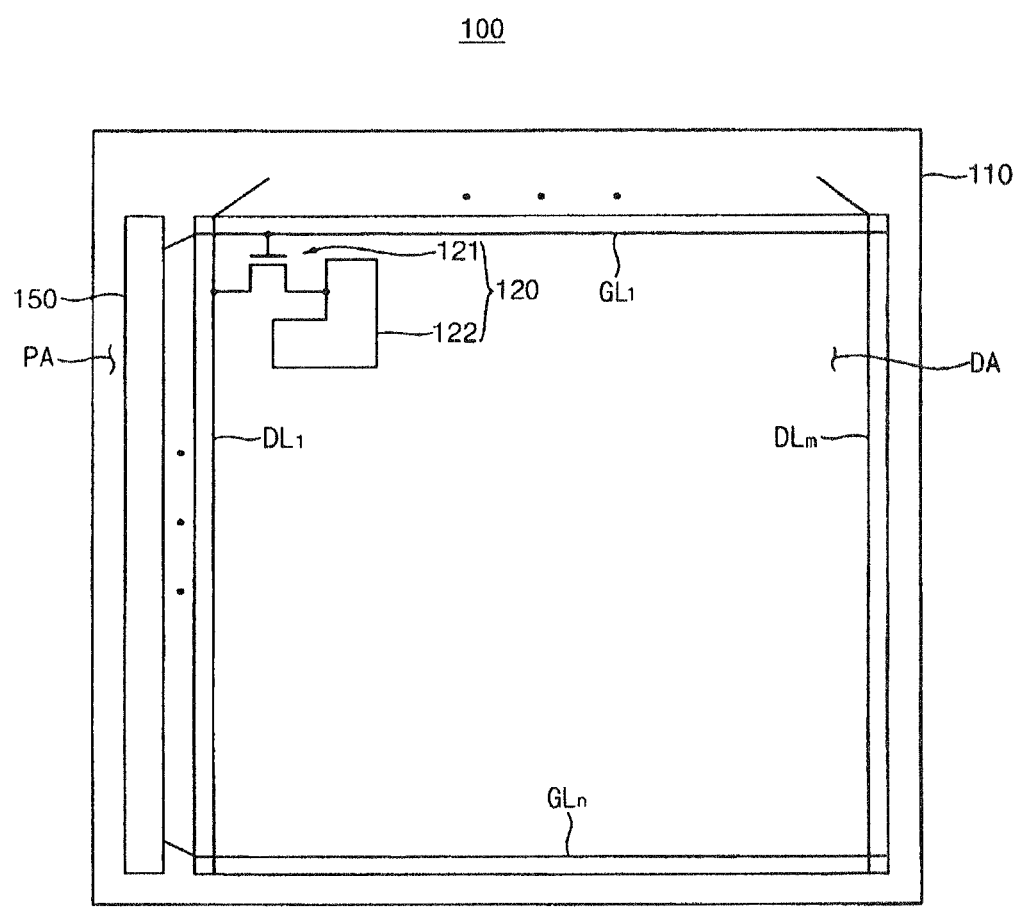
FIG. 1 is a plan view showing an array substrate according to an exemplary embodiment of the present invention.
Figure 2:
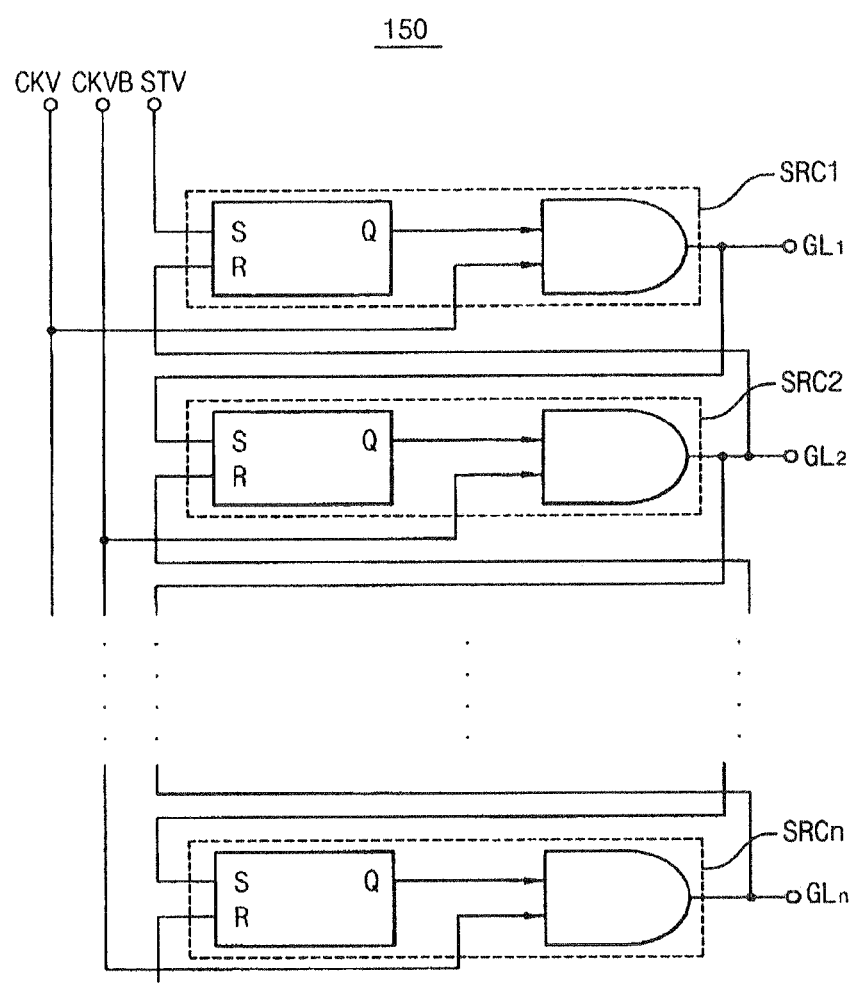
FIG. 2 is a block diagram showing a gate driving circuit in FIG. 1.

FIG. 1 is a plan view showing an array substrate 100 according to an exemplary embodiment of the present invention. FIG. 2 is a block diagram showing a gate driving circuit 150 in FIG. 1.

Referring to FIG. 1, the array substrate 100 includes a substrate 110, a pixel array 120 and the gate driving circuit 150.

The substrate 110 includes a display area DA and a peripheral area PA adjacent to the display area DA. The pixel array 120 is formed on the substrate 110 corresponding to the display area DA, and the gate driving circuit 150 is formed on the substrate 110 corresponding to the peripheral area PA. The pixel array 120 and the gate driving circuit 150 are formed on the substrate 110 by a thin film process.

The pixel array 120 includes a plurality of gate lines GL1 to GLn, a plurality of data lines DL1 to DLm, a plurality of thin film transistors (TFTs) 121 and a plurality of pixel electrodes 122. The gate lines GL1 to GLn intersect with and are insulated from the data lines DL1 to DLm. The TFTs 121 and the pixel electrodes 122 are formed on the substrate 110 in a matrix configuration. The TFTs 121 are electrically connected to a corresponding gate line and a corresponding data line. For example, a first TFT of the TFTs 121 includes a gate electrode electrically connected to a first gate line GL1, a source electrode electrically connected to a first data line DL1 and a drain electrode electrically connected to a first pixel electrode of the pixel electrodes 122.

The gate driving circuit 150 is formed in the peripheral area PA and is adjacent to an end of the gate lines GL1 to GLn. The gate driving circuit 150 is electrically connected to the end of the gate lines GL1 to GLn and sequentially outputs a gate signal to the gate lines GL1 to GLn.

As shown in FIG. 2, the gate driving circuit 150 includes a shift register. The shift register includes a plurality of stages SRC1, SRC2 ... SRCn-1, SRCn connected one after another to each other and the shift register sequentially outputs the gate signal. Each of the stages SRC1, SRC2 ... SRCn-1, SRCn includes an S-R latch and an AND-gate.

When the shift register is operated, the S-R latch of one of the stages SRC1, SRC2 ... SRCn-1, SRCn is activated in response to a previous gate signal from a previous stage and is inactivated in response to a next gate signal from a next stage. The AND-gate then generates the gate signal when the S-R latch is activated and a clock is applied at a high level.

For example, odd-numbered stages SRC1 to SRCn-1 receive a first clock CKV and even-numbered stages SRC2 to SRCn receive a second clock CKVB having a different phase than the first clock CKV. In an exemplary embodiment, the first and second clocks CKV and CKVB have a phase opposite to each other.

Thus, the AND-gate of the odd-numbered stages SRC1 to SRCn-1 generates the gate signal when the S-R latch is activated and the first clock CKV is applied at the high level. The AND-gate of the even-numbered stages SRC2 to SRCn generates the gate signal when the S-R latch is activated and the second clock CKVB is applied at the high level.

Figure 3:
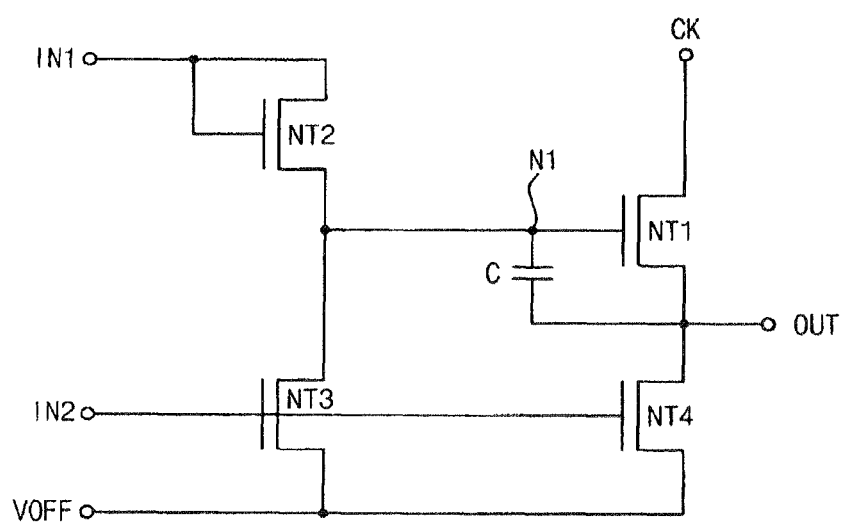
FIG. 3 is a circuit diagram of a stage in FIG. 2.
Figure 4:
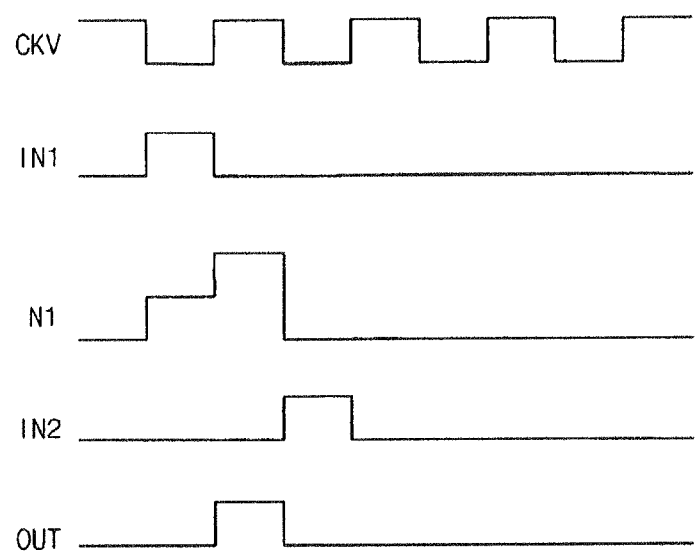
FIG. 4 is a waveform diagram of an electric potential of a first node and an output signal in FIG. 3.

FIG. 3 is a circuit diagram of one of the stages SRC1, SRC2 ... SRCn-1, SRCn in FIG. 2. FIG. 4 is a waveform diagram of an electric potential of a first node N1 and an output signal output from the output terminal OUT in FIG. 3.

Referring to FIG. 3, the stage includes a capacitor C, and first, second, third and fourth TFTs NT1, NT2, NT3 and NT4.

The first TFT NT1 includes a drain electrode connected to a clock terminal CK, a gate electrode connected to a first electrode of the capacitor C via the first node N1, and a source electrode connected to a second electrode of the capacitor C and an output terminal OUT. The clock terminal CK receives either the first clock CKV or the second clock CKVB having a phase opposite to the first clock CKV.

The second TFT NT2 includes a drain electrode and a gate electrode receiving a first input signal IN1, and a source electrode connected to a drain electrode of the third TFT NT3. In an exemplary embodiment, the first input signal IN1 is either a scan start signal STV or the previous gate signal of the previous stage.

The third TFT NT3 includes a gate electrode for receiving a second input signal IN2, a drain electrode connected to the source electrode of the second TFT NT2, and a source electrode for receiving an off voltage Voff. In an exemplary embodiment, the second input signal IN2 is the next gate signal of the next stage.

The fourth TFT NT4 includes a drain electrode connected to the source electrode of the first TFT NT1 and the second electrode of the capacitor C, a gate electrode for receiving the second input signal IN2, and a source electrode for receiving the off voltage Voff.

As shown in FIG. 4, when the first input signal IN1 is applied at a high level, the first node N1 has an electric potential at the high level. When the capacitor C is charged in response to the first input signal IN1, the electric potential of the first node N1 is bootstrapped, thereby raising the electric potential of the first node N1. According to the increase of the electric potential of the first node N1, the first TFT NT1 is turned on. The first clock CKV or the second clock CKVB applied through the clock terminal CK of FIG. 3 is then outputted as the gate signal to the output terminal OUT through the first TFT NT1.

Figure 5:
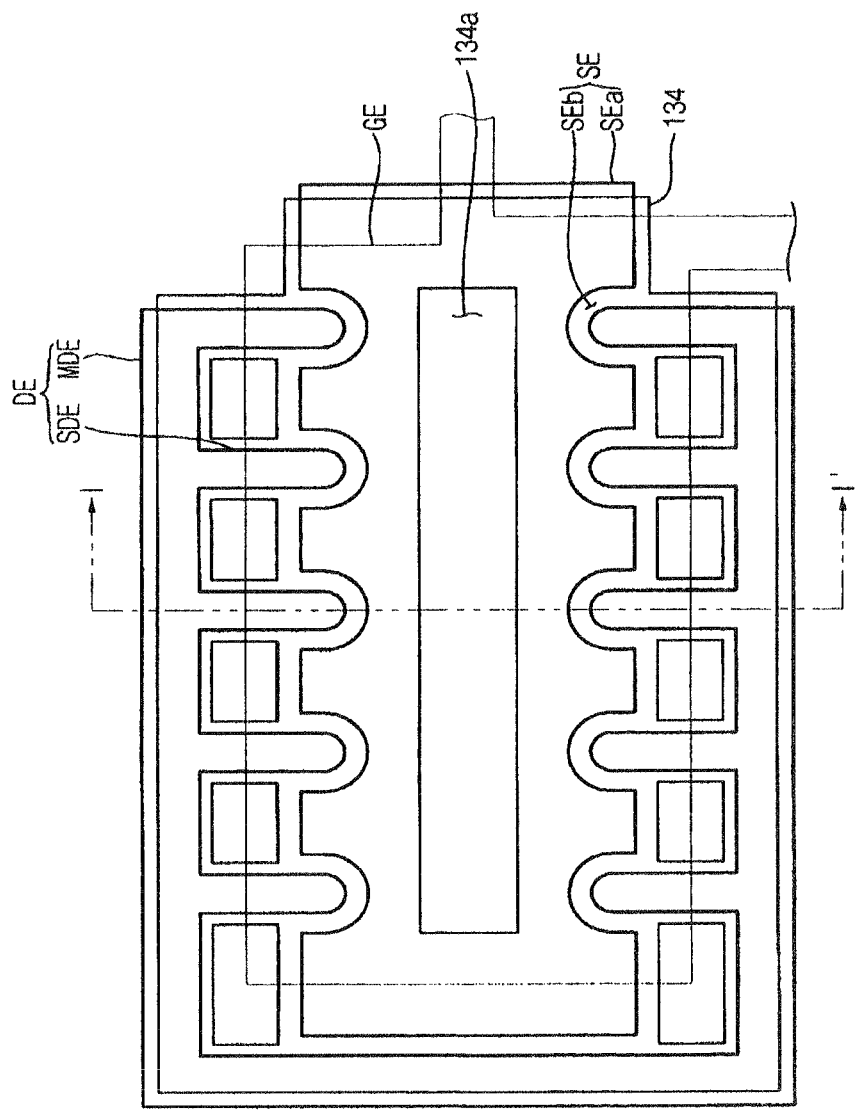
FIG. 5 is a plan view showing a layout of a first TFT and a capacitor in FIG. 3.
Figure 6:
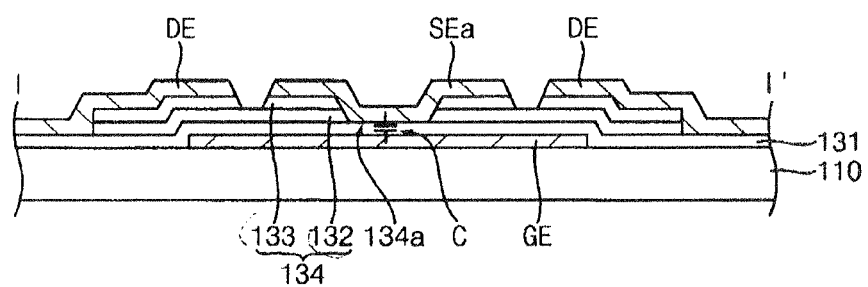
FIG. 6 is a cross-sectional view taken along a line showing the array substrate in FIG. 5.

FIG. 5 is a plan view showing a layout of the first TFT NT1 and the capacitor C in FIG. 3. FIG. 6 is a cross-sectional view taken along a line I-I' showing the array substrate in FIG. 5.

Referring to FIGS. 5 and 6, the gate electrode (e.g., GE) of the first TFT NT1 is formed on the substrate 110. The gate electrode GE has a generally rectangular shape. A gate insulating layer 131 is formed over the substrate 110 to cover the gate electrode GE.

A channel layer 134 is formed on the gate insulating layer 131 corresponding to the gate electrode GE. The channel layer 134 includes an active layer 132 and an ohmic contact layer 133 formed on the active layer 132. The active layer 132 includes a polycrystalline silicon, and the ohmic contact layer 133 includes an $N^+$-doped polycrystalline silicon.

The source electrode (e.g., SE) and the drain electrode (e.g., DE) of the first TFT NT1 are formed on the ohmic contact layer 133 and the gate insulating layer 131. The drain electrode DE includes a main drain electrode MDE and a plurality of sub drain electrodes SDE. The main drain electrode MDE is formed in an area outside an area where the gate electrode GE is formed. The sub drain electrodes SDE are branched from the main drain electrodes MDE and extended to the area where the gate electrode GE is formed, and the sub drain electrodes SDE are spaced apart from each other by a predetermined distance.

The source electrode SE includes an electrode body SEa and a plurality of electrode recesses SEb. The electrode recesses SEb generally have a U shape and receive the sub drain electrodes SDE. Thus, the source electrode SE and the sub drain electrode SDE face each other on the gate electrode GE.

As shown in FIG. 6, the channel layer 134 between the source electrode SE and the gate insulating layer 131 has an opening 134a through which the gate insulating layer 131 on the gate electrode GE partially makes contact with the source electrode SE. In other words, the opening 134a facilitates contact between a portion of the gate insulating layer 131 on the gate electrode GE with the source electrode SE. The capacitor C, shown for example in FIG. 3, is formed between the source electrode SE and the gate electrode GE.

In general, a charging capacity of a capacitor is substantially inversed in proportion to a space between two electrodes of the capacitor. Thus, when the channel layer 134 is partially removed to reduce the space between the source electrode SE and the gate electrode GE as shown in FIG. 6, the charging capacity of the capacitor C may be enhanced.

Therefore, the rise time of the gate signal outputted from the gate driving circuit 150 may be sufficiently ensured. Thus, the gate driving circuit 150 may have an improved output characteristic.

In addition, even though an area of the source and gate electrodes SE and GE is not increased, the charging capacity of the capacitor C may also be enhanced. Thus, the parasitic capacitance between the source and gate electrodes SE and GE and a common electrode (not shown) formed on an opposite substrate (not shown) may be prevented. The opposite substrate may be known as a common electrode substrate or a color filter substrate.

Figure 7:
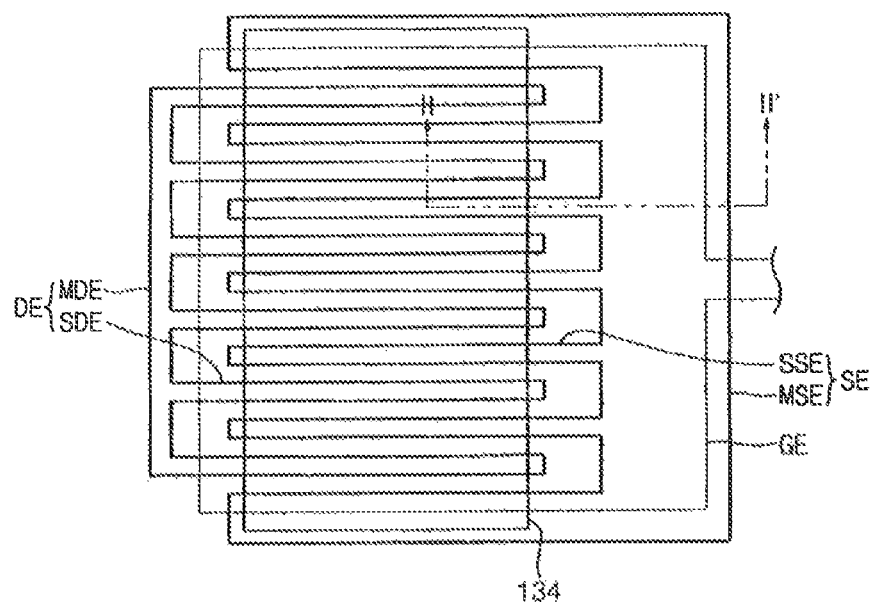
FIG. 7 is a plan view showing a layout of a first TFT and a capacitor according to another exemplary embodiment of the present invention.
Figure 8:
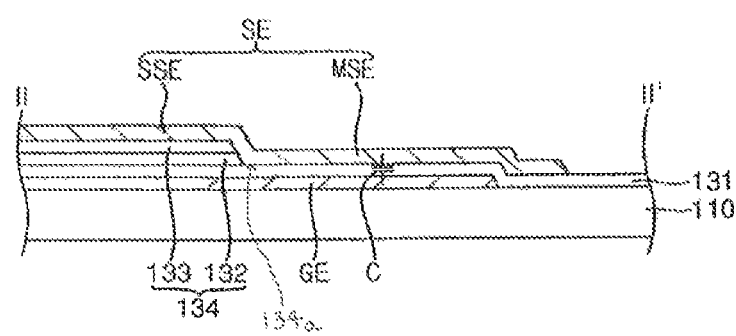
FIG. 8 is a cross-sectional view taken along a line II-II' of FIG. 7.

FIG. 7 is a plan view showing a layout of a first TFT NT1 and a capacitor C according to another exemplary embodiment of the present invention. FIG. 8 is a cross-sectional view taken along a line II-II' of FIG. 7.

Referring to FIGS. 7 and 8, a gate electrode GE of the first TFT NT1 is formed on the substrate 110. The gate electrode GE has a generally rectangular shape. A gate insulating layer 131 is formed over the substrate 110 to cover the gate electrode GE.

A channel layer 134 is formed on the gate insulating layer 131 corresponding to the gate electrode GE. The channel layer 134 includes an active layer 132 and an ohmic contact layer 133 formed on the active layer 132.

A source electrode SE and a drain electrode DE of the first TFT NT1 are formed on the ohmic contact layer 133 and the gate insulating layer 131. The drain electrode DE includes a main drain electrode MDE and a plurality of sub drain electrodes SDE. The main drain electrode MDE is formed in an area outside an area where the gate electrode GE is formed. The sub drain electrodes SDE are branched from the main drain electrodes MDE and extended to the area where the gate electrode GE is formed, and the sub drain electrodes SDE are spaced apart from each other by a predetermined distance.

The source electrode SE includes a main source electrode MSE and a plurality of sub source electrodes SSE. The main source electrode MSE is formed on the gate insulating layer 131 corresponding to the gate electrode GE and the main source electrode MSE faces the gate electrode GE. As shown in FIG. 8, the channel layer 134 between the sub source electrode SSE and the gate insulating layer 131 has an opening 134a through which the gate insulating layer 131 on the gate electrode GE partially makes contact with the main source electrode MSE. In other words, the opening 134a facilitates contact between a portion of the gate insulating layer 131 on the gate electrode GE and the main source electrode MSE.

As shown in FIGS. 7 and 8, when the channel layer 134 is partially removed to reduce the space between the main source electrode MSE and the gate electrode GE, the charging capacity of the capacitor C may be enhanced. Thus, the gate driving circuit 150 may have an improved output characteristic.

Figure 9:
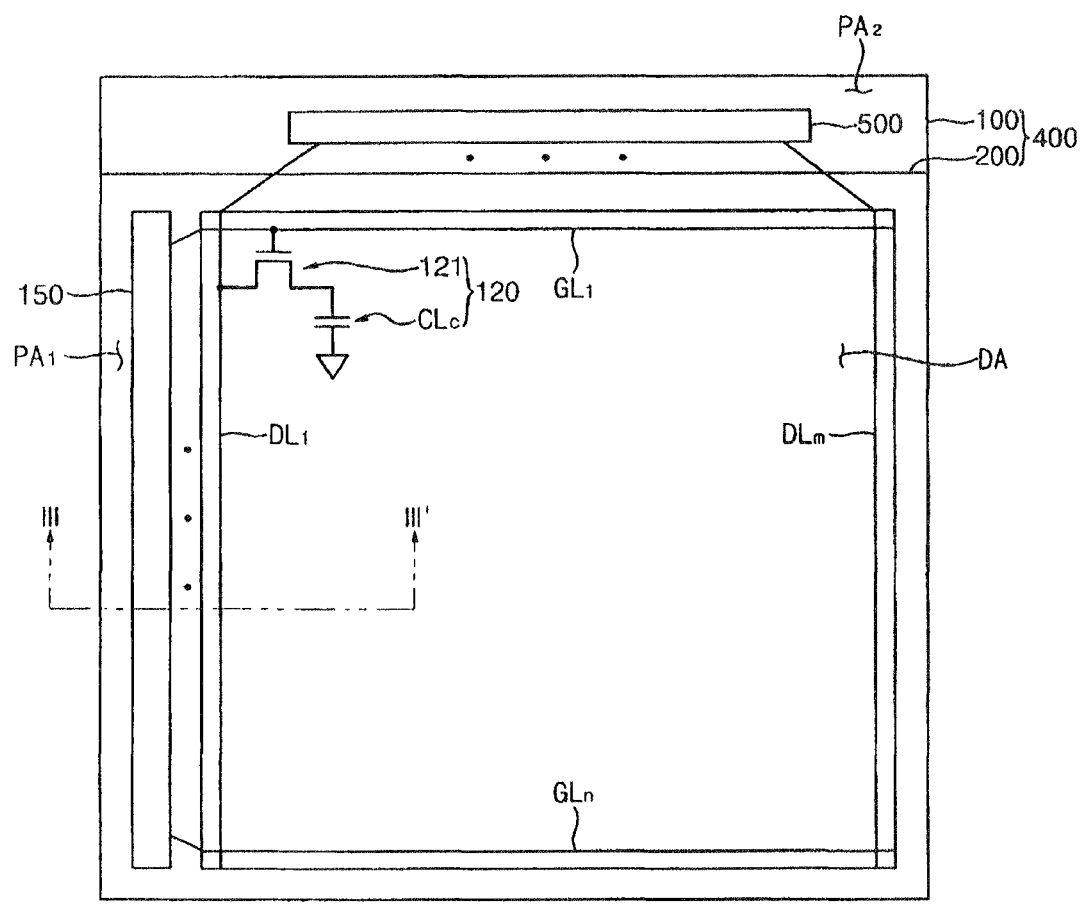
FIG. 9 is a plan view showing a display apparatus according to another exemplary embodiment of the present invention.
Figure 10:
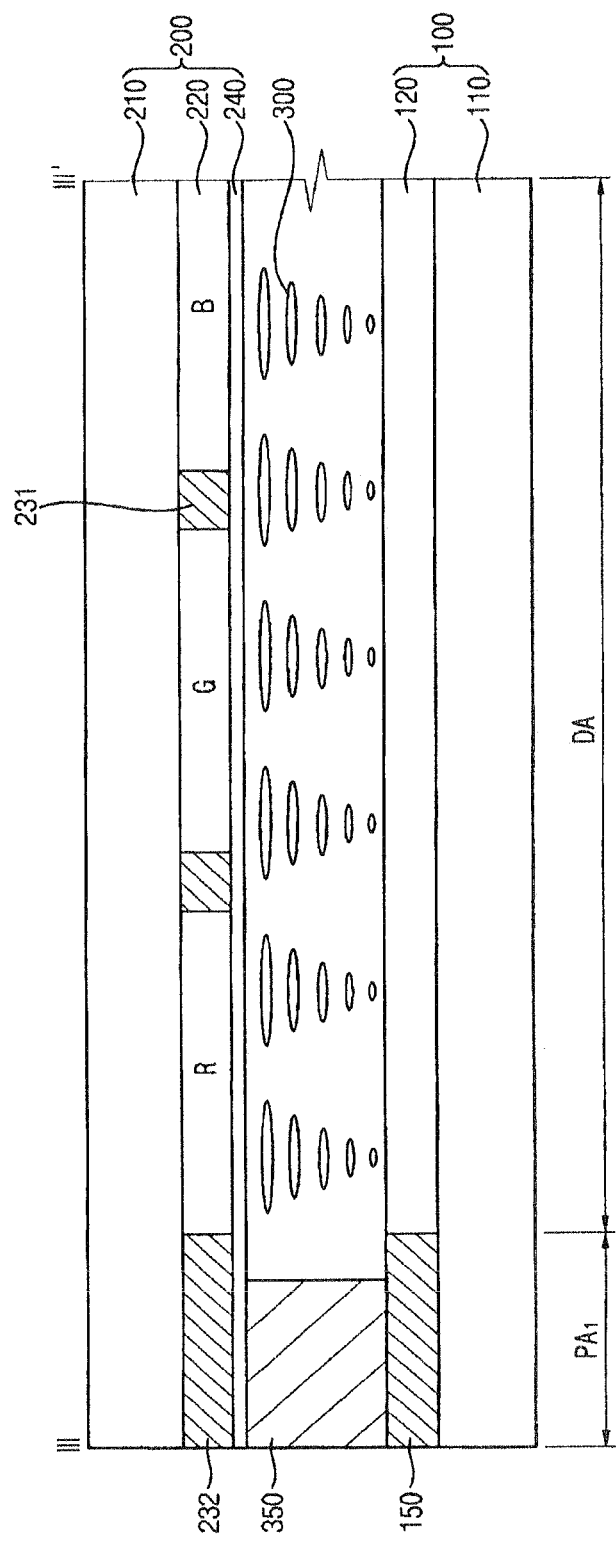
FIG. 10 is a cross-sectional view taken along a line III-III' showing the display apparatus in FIG. 9.

FIG. 9 is a plan view showing a display apparatus according to another exemplary embodiment of the present invention. FIG. 10 is a cross-sectional view taken along a line III-III' showing the display apparatus in FIG. 9.

Referring to FIGS. 9 and 10, a display apparatus 600 includes a display panel 400 that displays an image. The display panel 400 includes the array substrate 100 of, for example, FIG. 1, an opposite substrate 200, a liquid crystal layer 300 and a sealant 350. The opposite substrate may be known as a common electrode substrate or a color filter substrate.

The opposite substrate 200 includes a substrate 210, a color filter layer 220, a first black matrix 231, a second black matrix 232 and a common electrode 240. The opposite substrate 200 faces the array substrate 100.

The color filter layer 220 includes red, green and blue color pixels R, G and B and is formed on the substrate 210 corresponding to a display area DA. The first black matrix 231 is formed between two adjacent color pixels, and the second black matrix 232 is formed in an area corresponding to a first peripheral area PA1 surrounding the display area DA. The second black matrix 232 prevents the gate driving circuit 150 from being projected onto a screen of the display panel 400.

The liquid crystal layer 300 is disposed between the array substrate 100 and the opposite substrate 200 and is formed in the display area DA. The sealant 350 is disposed between the array substrate 100 and the opposite substrate 200 and is formed in the first peripheral area PA1. Thus, the sealant 350 may seal the liquid crystal layer 300.

The sealant 350 is also formed in an area corresponding to the area where the opposite substrate 200 partially covers the gate driving circuit 150. The sealant 350 includes a material having a lower dielectric constant than the liquid crystal layer 300. Thus, the parasitic capacitance between the common electrode 240 and the gate driving circuit 150 may be reduced. As a result, the display apparatus 600 may prevent the distortion of an input/output signal of the gate driving circuit 150, thereby preventing the malfunction thereof.

As shown in FIG. 9, the display apparatus 600 may further include a driving chip 500 mounted on the array substrate 100. The driving chip 500 is formed, for example, in a second peripheral area PA2 adjacent to the first peripheral area PA1. The driving chip 500 is electrically connected to the data lines DL1 to DLm formed on the array substrate 100 and applies the data signal to the data lines DL1 to DLm. Alternatively, the driving chip 500 may be formed on a film.

According to an exemplary embodiment of the present invention, the channel layer between the gate insulating layer and the source electrode of the transistor connected to the output terminal of the gate driving circuit has an opening through which the gate insulating layer on the gate electrode partially makes contact with the source electrode.

Thus, the capacitor between the gate electrode and the source electrode may have an enhanced charging capacity. As a result, the rise time of the gate signal may be sufficiently ensured, to thereby prevent the deterioration of the output characteristic of the gate driving circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An array substrate comprising:
    a substrate having a display area and a peripheral area adjacent to the display area;
    a pixel array that receives a driving signal, the pixel array formed on the substrate corresponding to the display area; and
    a driving circuit having a plurality of stages, and formed on the substrate corresponding to the peripheral area,
    wherein each of the stages comprises:
    a first transistor having a gate electrode, a source electrode, a drain electrode, a state insulating layer that electrically insulates the gate electrode from the source and drain electrode, and a channel layer disposed on the gate insulating layer,
    wherein the source electrode comprises:
    a main source electrode extending in a first direction and a plurality of sub source electrodes branched from a first side of the main source electrode, wherein the first side of the main source electrode extends in the first direction and is adjacent to the plurality of sub source electrodes, and a second side of the main source electrode extends in the first direction and is spaced apart from the first side along a second direction that is substantially perpendicular to the first direction,
    the drain electrode comprises a main drain electrode extending in the first direction and a plurality of sub drain electrodes branched from the main drain electrode and arranged at predetermined intervals,
    wherein the first side of the main source electrode is opposite to the second side of the main source electrode and the first side of the main source electrode is closer to the sub source electrodes than the second side of the main source electrode,
    wherein the main source electrode is spaced apart from the channel layer in a plan view so that a portion of the first side of the main source electrode between two adjacent sub source electrodes is overlapped by the gate electrode without the channel layer disposed therebetween,
    wherein the portion of the first side of the main source electrode between the two adjacent sub source electrodes faces a sub drain electrode between the two adjacent sub source electrodes, and
    wherein the gate insulating layer on the Rate electrode makes contact with the main source electrode where the channel layer is not present to form a capacitor.

2. The array substrate of claim 1, wherein the sub source electrodes are spaced apart from the sub drain electrodes by a first distance on the gate electrode.

3. The array substrate of claim 1, wherein the channel layer includes an ohmic contact layer and an active layer and a side of an opening of the channel layer is defined by an edge of each of the ohmic contact layer and the active layer.

4. A display apparatus comprising:
    an array substrate; and
    an opposite substrate facing the array substrate,
    the array substrate comprising:
    a substrate having a display area and a peripheral area adjacent to the display area;
    a pixel array that receives a driving signal, the pixel array formed on the substrate corresponding to the display area; and
    a driving circuit having a plurality of stages, and formed on the substrate corresponding to the peripheral area,
    wherein each of the stages comprises:
    a transistor having a gate electrode, a source electrode, a drain electrode, a gate insulating layer that electrically insulates the gate electrode from the source and drain electrode, and a channel layer disposed on the gate insulating layer,
    wherein the source electrode comprises:
    a main source electrode extending in a first direction and a plurality of sub source electrodes branched from a first side of the main source electrode, wherein the first side of the main source electrode extends in the first direction and is adjacent to the plurality of sub source electrodes, and a second side of the main source electrode extends in the first direction and is spaced apart from the first side along a second direction that is substantially perpendicular to the first direction,
    the drain electrode comprises a main drain electrode extending in the first direction and a plurality of sub drain electrodes branched from the main drain electrode and arranged at predetermined intervals,
    wherein the first side of the main source electrode is opposite to the second side of the main source electrode and the first side of the main source electrode is closer to the sub source electrodes than the second side of the main source electrode,
    wherein the main source electrode is spaced apart from the channel layer in a plan view so that a portion of the first side of the main source electrode between two adjacent sub source electrodes is overlapped by the gate electrode without the channel layer disposed therebetween,
    wherein the portion of the first side of the main source electrode between the two adjacent sub source electrodes faces a sub drain electrode between the two adjacent sub source electrodes, and
    wherein the gate insulating layer on the gate electrode makes contact with the main source electrode where the channel layer is not present to form a capacitor.

5. The display apparatus of claim 4, wherein the channel layer includes an ohmic contact layer and an active layer and a side of an opening of the channel layer is defined by an edge of each of the ohmic contact layer ar d the active layer.

6. The display apparatus of claim 4, further comprising:
a liquid crystal layer disposed between the array substrate and the opposite substrate; and
a sealant disposed between the array substrate and the opposite substrate that seals the liquid crystal layer.

7. The display apparatus of claim 6, wherein the sealant is overlapped by the driving circuit.

8. The display apparatus of claim 4, wherein the opposite substrate comprises:
a substrate;
a common electrode; and
a color filter layer disposed between the substrate and the common electrode,
the color filter layer comprising:
color pixels formed on a portion of the substrate corresponding to the display area;
a first black matrix formed between adjacent color pixels; and
a second black matrix formed in an area corresponding to the peripheral area.

9. The display apparatus of claim 4, wherein the plurality of stages are connected one after another to each other.

10. A display apparatus comprising:
an array substrate;
an opposite substrate facing the array substrate;
a liquid crystal layer disposed between the array substrate and the opposite substrate; and
the array substrate comprising:
a substrate having a display area and a first peripheral area adjacent to the display area;
a pixel array that receives a gate signal and a data signal, the pixel array formed on the substrate corresponding to the display area, wherein the pixel array receives the data signal from a data driving circuit; and
a driving circuit having a plurality of stages, and formed on the substrate corresponding to the first peripheral area to apply the gate signal to the pixel array,
wherein each of the stages comprises:
a transistor having a gate electrode, a source electrode, which is electrically connected to an output terminal configured to output the gate signal to the pixel array, a drain electrode, which is directly connected to a clock terminal, a gate insulating layer that electrically insulates the gate electrode from the source and drain electrode, and a channel layer disposed on the gate insulating layer,
wherein the source electrode comprises:
a main source electrode extending in a first direction, and a plurality of sub source electrodes branched from the main source electrode and arranged at predetermined first intervals,
the drain electrode comprises a main drain electrode extending in the first direction and a plurality of sub drain electrodes branched from the main drain electrode and arranged at predetermined second intervals,
wherein the main source electrode is spaced apart from the channel layer in a plan view so that a portion of the main source electrode is overlapped by the gate electrode without the channel layer disposed therebetween,
wherein the portion of the main source electrode is a first side of the main source electrode connected between two adjacent sub source electrodes and facing a sub drain electrode between the two adjacent sub source electrodes,
wherein the first side of the main source electrode is opposite to the second side of the main source electrode and the first side of the main source electrode is closer to the sub source electrodes than the second side of the main source electrode, and
wherein the gate insulating layer on the gate electrode makes contact with the main source electrode where the channel layer is not present to form a capacitor.

11. The display apparatus of claim 10, wherein the data driving circuit is formed in a second peripheral area adjacent to the first peripheral area.

12. The display apparatus of claim 10, wherein the plurality of stages are connected one after another to each other.

13. The display apparatus of claim 10, wherein the data driving circuit is formed on a film.

14. A display apparatus comprising:
art array substrate;
an opposite substrate facing the array substrate;
a crystal layer disposed between the array substrate and the opposite substrate; and
the array substrate comprising:
a substrate having a display area and a first peripheral area adjacent to the display area;
a pixel array that receives a gate signal and a data signal, the pixel array formed on the substrate corresponding to the display area, wherein the pixel array receives the data signal from the data driving circuit; and
a driving circuit having a plurality of stages, and formed on the substrate corresponding to the first peripheral area to apply the gate signal to the pixel array,
wherein each of the stages comprises:
a transistor having a gate electrode, a source electrode, which is electrically connected to an output terminal configured to output the gate signal to the pixel array, a drain electrode, which is directly connected to a clock terminal, a gate insulating layer that electrically insulates the gate electrode from the source and drain electrode, and a channel layer disposed on the gate insulating layer,
wherein the source electrode comprises:
a main source electrode extending in a first direction and a plurality of sub source electrodes electrically connected to the main source electrode,
the drain electrode comprises a main drain electrode extending in the first direction, and a plurality of sub drain electrodes branched from the main drain electrode and arranged at predetermined intervals,
wherein the main source electrode is spaced apart from the channel layer in a plan view so that a portion of the main source electrode is overlapped by the gate electrode without the channel layer disposed therebetween,
wherein the portion of the main source electrode is a first side of the main source electrode connected between two adjacent sub source electrodes and facing a sub drain electrode between the two adjacent sub source electrodes,
wherein the first side of the main source electrode is opposite to the second side of the main source electrode and the first side of the main source electrode is closer to the sub source electrodes than the second side of the main source electrode, and
wherein the gate insulating layer on the gate electrode makes contact with the main source electrode where the channel layer is not present to form a capacitor.

15. The array substrate of claim 1, wherein the sub drain electrodes are disposed between adjacent sub source electrodes such that the sub drain electrodes and the sub source electrodes are alternately arranged along the first direction.

16. The display apparatus of claim 4, wherein the sub drain electrodes are disposed between adjacent sub source electrodes such that the sub drain electrodes and the sub source electrodes are alternately arranged along the first direction.

17. The display apparatus of claim 10, wherein the sub drain electrodes are disposed between adjacent sub source electrodes such that the sub drain electrodes and the sub source electrodes are alternately arranged along the first direction.

18. The display apparatus of claim 14, wherein the sub drain electrodes are disposed between adjacent sub source electrodes such that the sub drain electrodes and the sub source electrodes are alternately arranged.

* * * * *